(12) United States Patent
Mengel et al.

(10) Patent No.: US 9,093,416 B2
(45) Date of Patent: Jul. 28, 2015

(54) CHIP-PACKAGE AND A METHOD FOR FORMING A CHIP-PACKAGE

(75) Inventors: Manfred Mengel, Bad Abbach (DE); Thomas Wowra, Munich (DE); Joachim Mahler, Regensburg (DE); Khalil Hosseini, Weihmichl (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 789 days.

(21) Appl. No.: 13/304,795

(22) Filed: Nov. 28, 2011

(65) Prior Publication Data

US 2013/0134589 A1    May 30, 2013

(51) Int. Cl.
*H01L 23/495* (2006.01)
*H01L 23/02* (2006.01)
(Continued)

(52) U.S. Cl.
CPC ............ *H01L 23/3677* (2013.01); *H01L 24/19* (2013.01); *H01L 24/20* (2013.01); *H01L 24/24* (2013.01); *H01L 24/82* (2013.01); *H01L 2224/04105* (2013.01);
(Continued)

(58) Field of Classification Search
CPC .............. H01L 23/485; H01L 23/3135; H01L 23/4334; H01L 2924/00; H01L 2924/01029; H01L 2924/01078; H01L 2924/01079; H01L 2224/04105; H01L 2224/48247; H01L 2224/32245; H01L 2224/48091; H01L 21/673; H01L 21/6835; H01L 21/31; H01L 21/3205; H01L 21/469; H01L 21/4763; H01L 21/76877; H01L 2221/68304; H01L 2221/68327; H01L 2221/68354; H01L 2221/1057; H01L 23/28; H01L 23/31; H01L 23/3107; H01L 23/3185; H01L 23/498; H01L 2924/12032; H01L 2924/1301; H01L 2924/13034; H01L 2924/1305; H01L 2924/13055; H01L 2924/1306; H01L 2924/13091; H01L 2924/00014; H01L 2224/96; H01L 2224/82; H01L 2224/73267; H01L 2224/82005; H01L 2224/82039; H01L 2224/82101; H01L 23/3677; H01L 24/19; H01L 24/20; H01L 24/24; H01L 24/82
USPC ......... 257/666, 668, 676, 678, 700, 701, 702, 257/782, 787, 788, 790, 796, 741
See application file for complete search history.

(56) References Cited

U.S. PATENT DOCUMENTS 6,534,858 B2 *  3/2003  Akram et al. ................. 257/706
7,727,813 B2    6/2010  Otremba et al.
(Continued)

FOREIGN PATENT DOCUMENTS

DE    102006021959 A1   11/2007
DE    102006047761 A1   4/2008
DE    102008057707 A1   6/2009
DE    102008062498 A1   7/2009

*Primary Examiner* — Teresa M Arroyo

(57) ABSTRACT

A chip-package includes a chip-carrier configured to carry a chip, the chip arranged over a chip-carrier side, wherein the chip-carrier side is configured in electrical connection with a chip back side; an insulation material including: a first insulation portion formed over a first chip lateral side; a second insulation portion formed over a second chip lateral side, wherein the first chip lateral side and the second chip lateral side each abuts opposite edges of the chip back side; and a third insulation portion formed over at least part of a chip front side, the chip front side including one or more electrical contacts formed within the chip front side; wherein at least part of the first insulation portion is arranged over the chip-carrier side and wherein the first insulation portion is configured to extend in a direction perpendicular to the first chip lateral side further than the chip-carrier.

15 Claims, 11 Drawing Sheets

(51) Int. Cl.
*H01L 23/28* (2006.01)
*H01L 23/29* (2006.01)
*H01L 23/48* (2006.01)
*H01L 23/52* (2006.01)
*H01L 29/40* (2006.01)
*H01L 23/367* (2006.01)
*H01L 23/00* (2006.01)

(52) U.S. Cl.
CPC ............... *H01L 2224/32245* (2013.01); *H01L 2224/73267* (2013.01); *H01L 2224/82005* (2013.01); *H01L 2224/82039* (2013.01); *H01L 2224/82101* (2013.01); *H01L 2224/96* (2013.01); *H01L 2924/12032* (2013.01); *H01L 2924/1301* (2013.01); *H01L 2924/1305* (2013.01); *H01L 2924/1306* (2013.01); *H01L 2924/13034* (2013.01); *H01L 2924/13055* (2013.01); *H01L 2924/13091* (2013.01)

(56) References Cited

U.S. PATENT DOCUMENTS

| | | | |
|---|---|---|---|
| 7,799,614 B2 | 9/2010 | Otremba et al. | |
| 7,800,217 B2 | 9/2010 | Otremba et al. | |
| 8,410,592 B2 | 4/2013 | Otremba et al. | |
| 2004/0171191 A1* | 9/2004 | Connell et al. | 438/112 |
| 2006/0087045 A1* | 4/2006 | Yamano et al. | 257/787 |
| 2007/0262432 A1* | 11/2007 | Otremba | 257/678 |
| 2009/0072379 A1* | 3/2009 | Ewe et al. | 257/700 |
| 2009/0160046 A1* | 6/2009 | Otremba et al. | 257/700 |
| 2009/0194885 A1* | 8/2009 | Jobetto | 257/773 |
| 2009/0273063 A1* | 11/2009 | Nikitin et al. | 257/666 |
| 2010/0025829 A1* | 2/2010 | Mengel et al. | 257/676 |
| 2010/0072628 A1* | 3/2010 | Nikitin et al. | 257/774 |
| 2010/0078783 A1* | 4/2010 | Otremba | 257/676 |
| 2010/0200978 A1* | 8/2010 | Mengel et al. | 257/690 |

* cited by examiner

~ 110 forming an isolation material by forming a first isolation portion over a first chip lateral side, forming a second isolation portion over a second chip lateral side, wherein the first chip lateral side and the second chip lateral side each abuts opposite edges of a chip back side; and
forming a third isolation portion over at least part of a chip front side, the chip front side comprising one or more electrical contacts formed within the chip front side; and arranging the chip over a chip-carrier side, wherein the chip-carrier side is in electrical connection with the chip back side;
wherein at least part of the first isolation portion is arranged over the chip-carrier side wherein the first isolation portion extends in a direction perpendicular to the first chip lateral side further than the chip-carrier.

~ 120

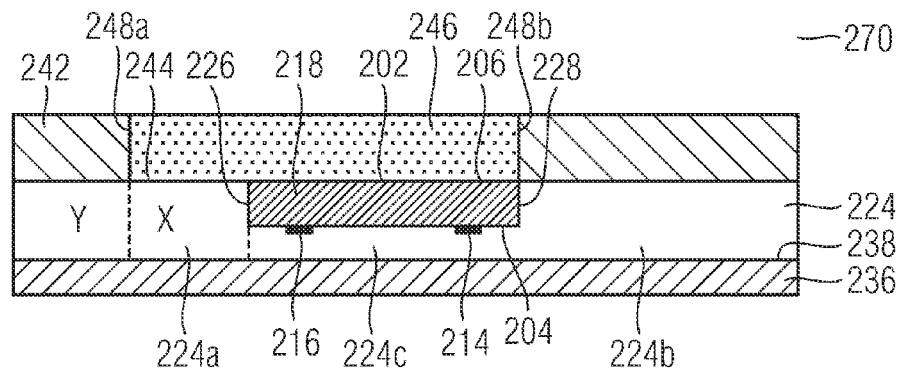
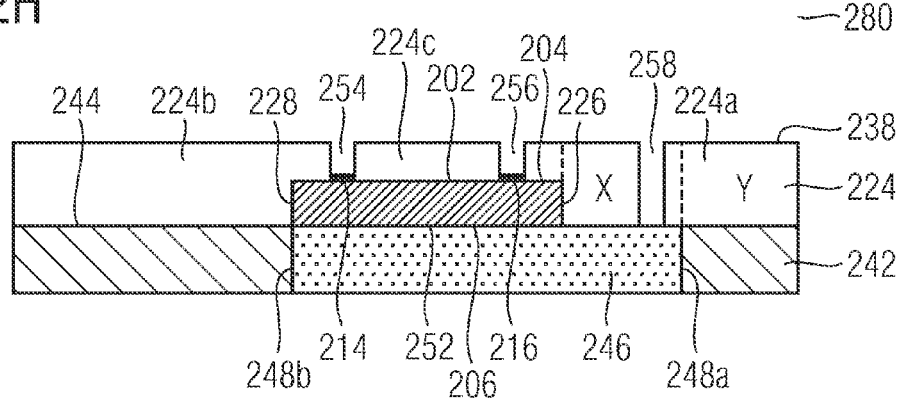
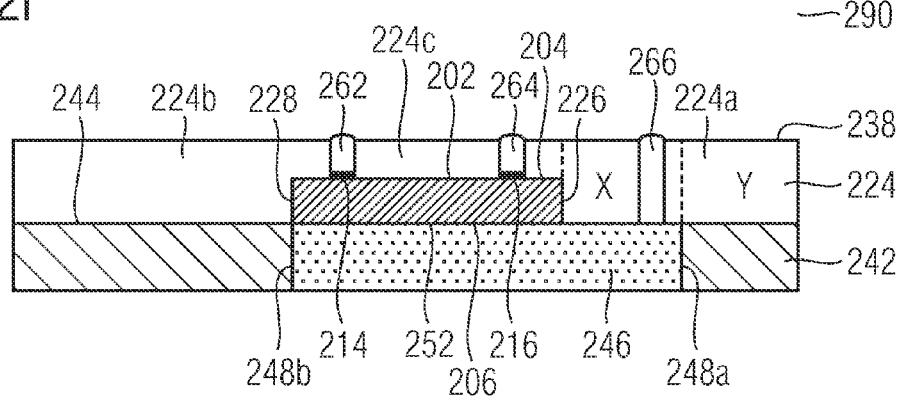

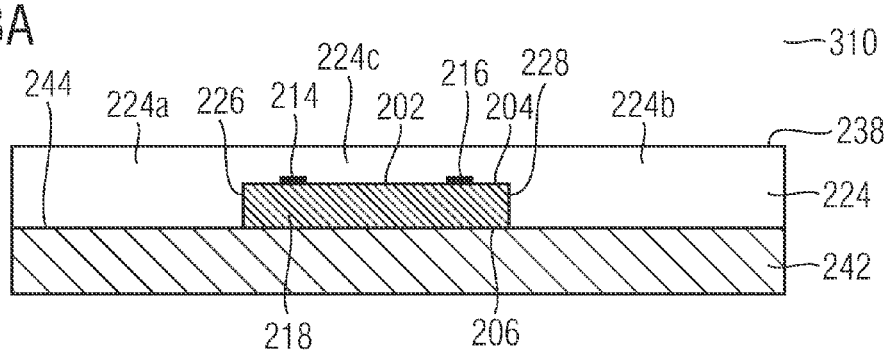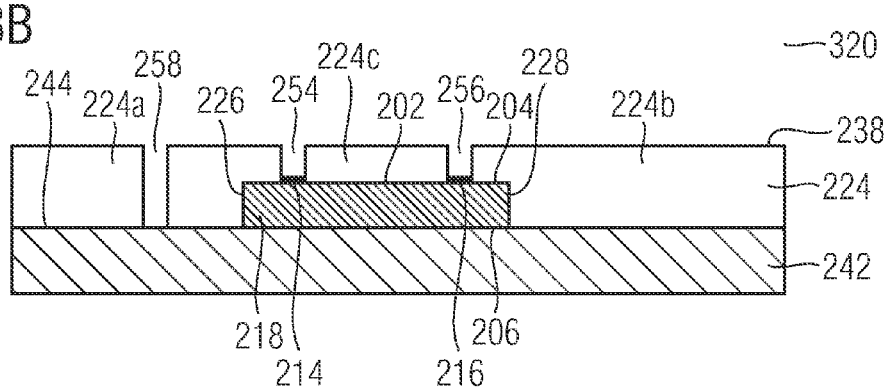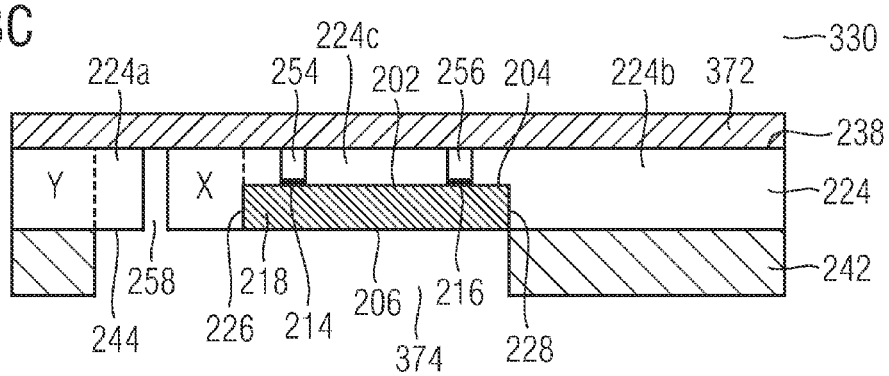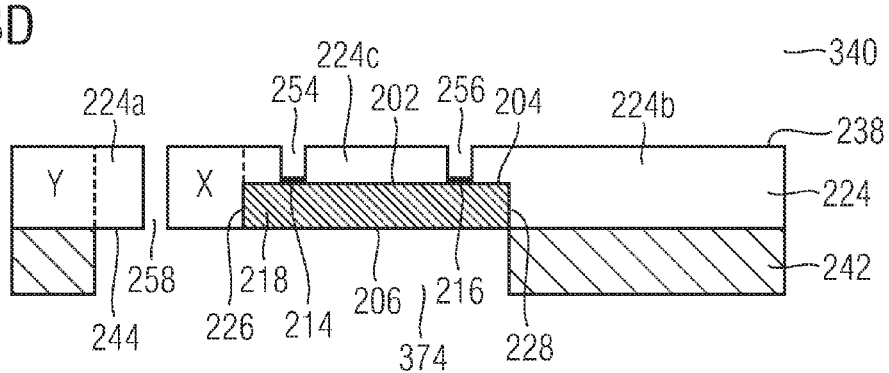

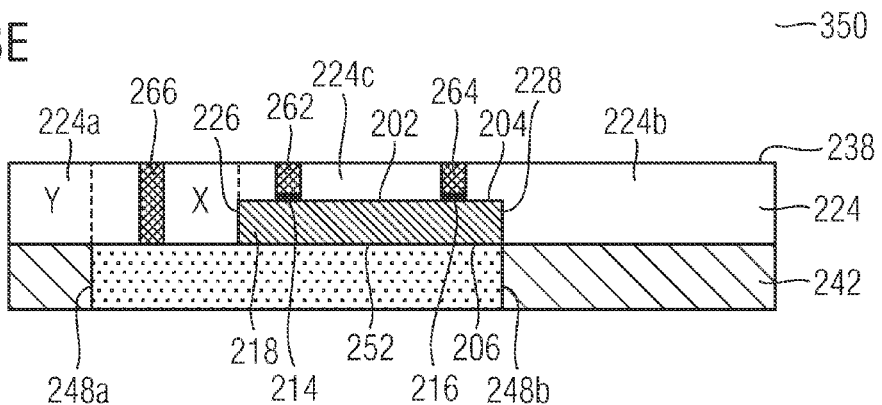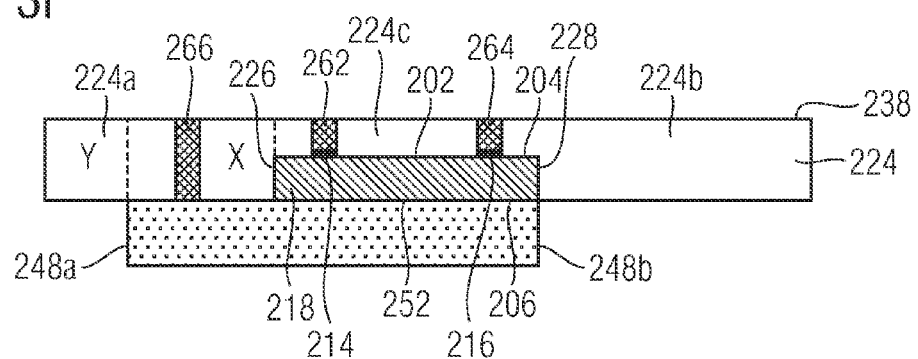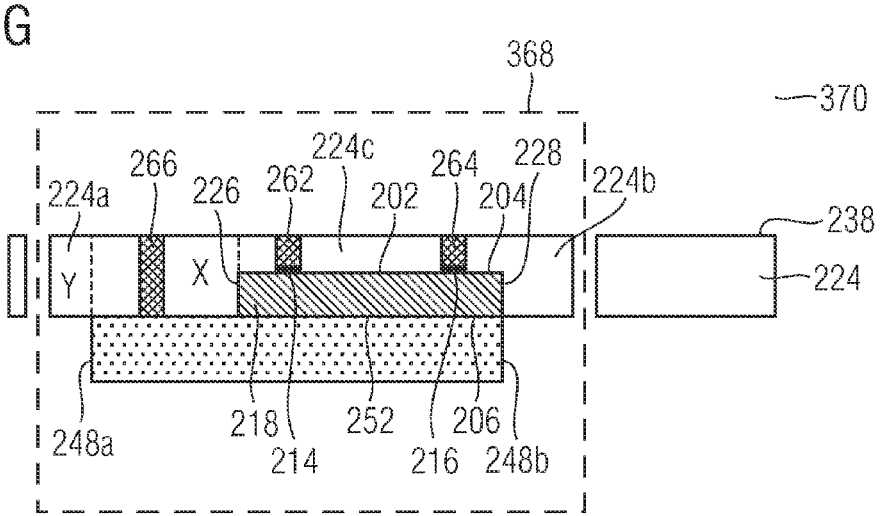

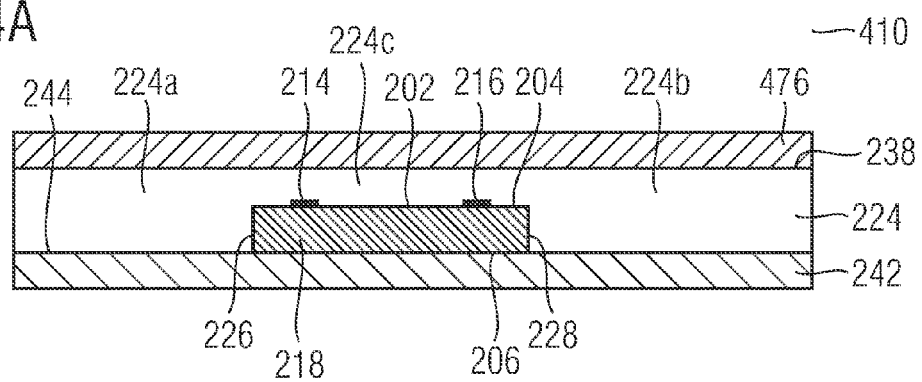
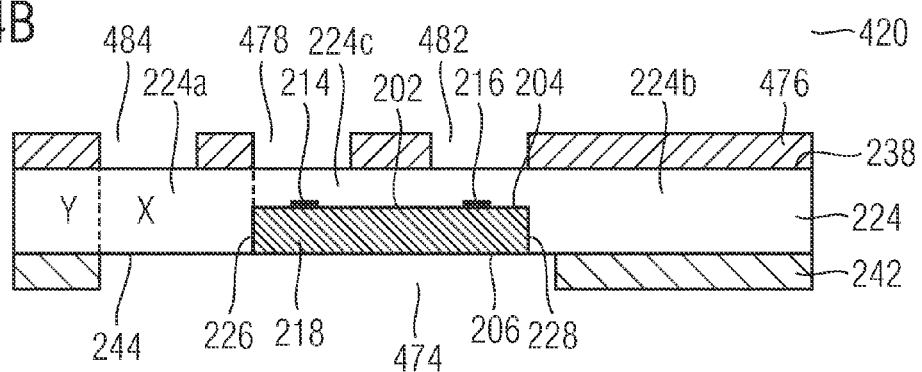
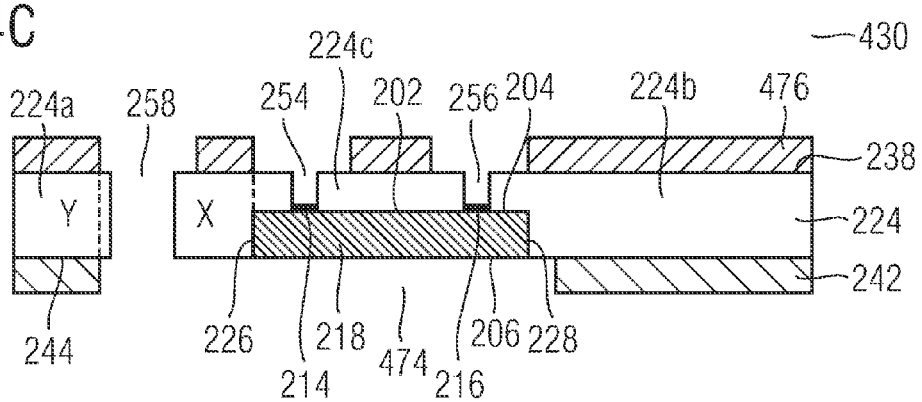
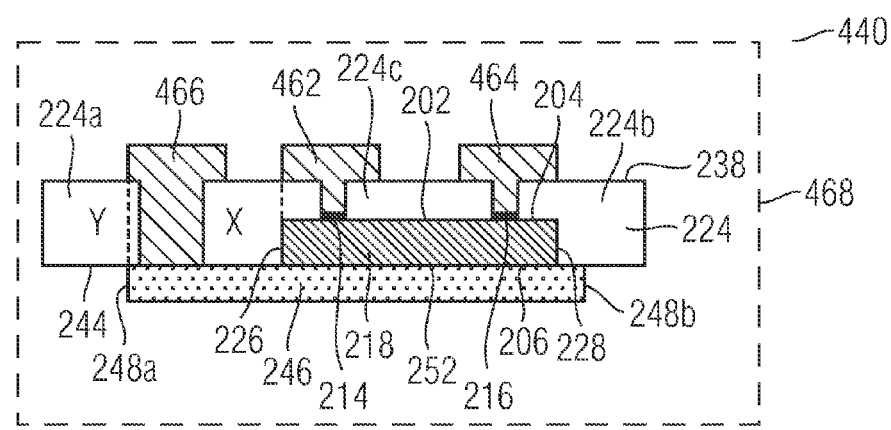

CHIP-PACKAGE AND A METHOD FOR FORMING A CHIP-PACKAGE

TECHNICAL FIELD

Various embodiments relate generally to a chip-package and a method for forming a chip-package.

BACKGROUND

Chip embedding technology, for example, in the field of semiconductor chip-package construction, places high requirements on the individual processes of creating a package. Difficulties may arise during the die attach process, for example with respect to x-y tolerances, leadframe deflection, and bond line thicknesses. Further difficulties may arise in the deposition of source/drain and gate contacts, for example during the fabrication of power semiconductor devices. Further difficulties may arise during sawing processes for module individualization. Sawing through a combination of materials, ranging from, for example, resin for embedding materials, to, for example copper leadframes, may introduce saw edges and impurities. For a package to be individualized, a large area of copper, which may be part of a copper leadframe, is typically processed during the process chain, and therefore a large portion of the leadframe must be removed by etching techniques.

In addition to the difficulties of the process control and yield losses, high costs for the development of current chip-embedding technologies, and increasing manufacturing costs due to the application of a large area copper carrier may add to difficulties for a possible launch in the semiconductor market.

SUMMARY

Various embodiments provide a chip-package, the chip-package including a chip-carrier configured to carry a chip, the chip arranged over a chip-carrier side, wherein the chip-carrier side is configured to be in electrical connection with a chip back side; an insulation material including: a first insulation portion formed over a first chip lateral side; a second insulation portion formed over a second chip lateral side, wherein the first chip lateral side and the second chip lateral side each abuts opposite edges of the chip back side; and a third insulation portion formed over at least part of a chip front side, the chip front side including one or more electrical contacts formed within the chip front side; wherein at least part of the first insulation portion is arranged over the chip-carrier side and wherein the first insulation portion is configured to extend in a direction perpendicular to the first chip lateral side further than the chip-carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 provides a method for forming a chip-package according to an embodiment;

FIGS. 2A to 2J provide a method for forming a chip-package according to an embodiment, and FIG. 2J additionally provides a chip-package according to an embodiment;

FIGS. 3A to 3G provide a method for forming a chip-package according to an embodiment, and FIG. 3G additionally provides a chip-package according to an embodiment;

FIGS. 4A to 4D provide a method for forming a chip-package according to an embodiment, and FIG. 4D provides a chip-package according to an embodiment;

DETAILED DESCRIPTION

Figure 2A:
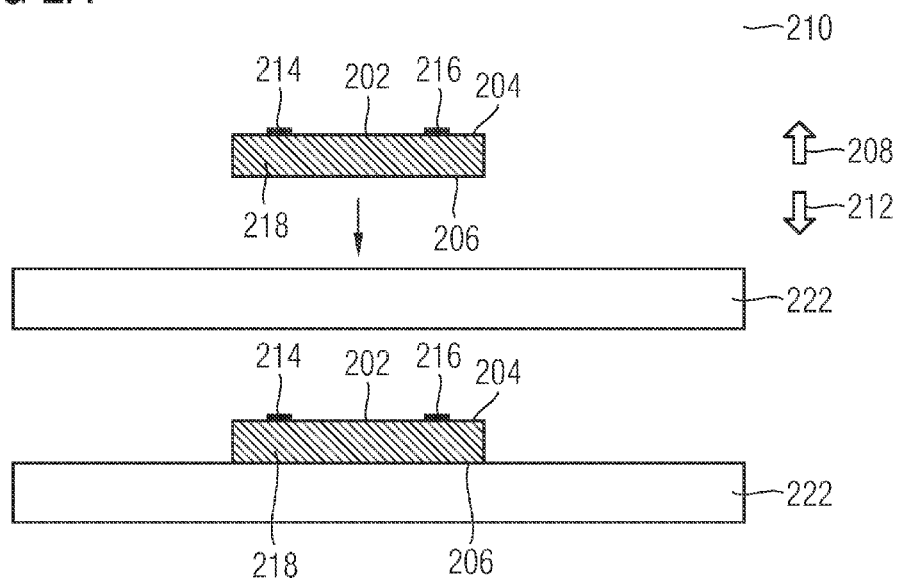

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments provide a method for embedding a chip, wherein common die attach processes for adhering a chip to a leadframe are no longer necessary.

Various embodiments provide a method for forming a chip-package without a leadframe carrier.

Various embodiments provide a chip-package with a deposited chip back side drain contact, thereby eliminating the need for adhering a leadframe carrier to the chip back side, and thereby eliminating the need for sawing through a leadframe carrier to individualize an embedded chip.

FIG. 1 shows a method 100 for forming a chip-package according to an embodiment. The method may include:

forming an insulation material by forming a first insulation portion over a first chip lateral side, forming a second insulation portion over a second chip lateral side, wherein the first chip lateral side and the second chip lateral side each abuts opposite edges of a chip back side; and forming a third insulation portion over at least part of a chip front side, the chip front side including one or more electrical contacts formed within the chip front side (in 110); and arranging the chip over a chip-carrier side, wherein the chip-carrier side is in electrical connection with the chip back side; wherein at least part of the first insulation portion is arranged over the chip-carrier side wherein the first insulation portion extends in a direction perpendicular to the first chip lateral side further than the chip-carrier (in 120).

FIGS. 2A to 2J show a method 200 for forming a chip-package according to an embodiment.

Chip 202, e.g. a semiconductor die, e.g. a semiconductor chip, may include one or more semiconductor devices. The one or more semiconductor devices may include at least one semiconductor device from the following group of semiconductor devices, the group consisting of: a transistor, a MOS transistor, a bipolar transistor, a field effect transistor, a diode, and the like. Chip 202 may include one or more power semiconductor devices. The one or more power semiconductor devices may include at least one power semiconductor device from the following group of power semiconductor devices, the group consisting of: a power transistor, a power MOS transistor, a power bipolar transistor, a power field effect transistor, a power insulated gate bipolar transistor IGBT, a thyristor, a MOS controlled thyristors, a silicon controlled rectifier, a power schottky diode, a silicon carbide diode, a gallium nitride device.

Chip 202 may include chip front side 204 and chip back side 206. Chip front side 204 may face a direction opposite to a direction that chip back side 206 faces, e.g. chip front side 204 may face direction 208 opposite to direction 212 that chip back side 206 faces.

Chip front side 204 may include one or more electrical contacts 214, 216 formed within chip front side 204. One or more electrical contacts 214, 216 may include at least one of a gate contact, a source contact and a drain contact, e.g. electrical contact 214 may include a source contact of a power transistor, e.g. electrical contact 216 may include a drain contact of a power transistor. One or more electrical contacts 214, 216 may be formed over a surface of chip front side 204. One or more electrical contacts 214, 216 may be formed over a surface of chip front side 204 and within the surface area of the surface of chip front side 204.

Chip back side 206 may include at least one electrical contact 218 formed over chip back side 206 for a semiconductor device. At least one electrical contact 218 may include an electrical contact pad for a semiconductor device. Chip back side 206 may be the at least one electrical contact 218, wherein at least one electrical contact 218 may include a drain contact for a semiconductor device. Chip back side 206 may be the at least one electrical contact 218, wherein at least one electrical contact 218 may include at least one of a source contact and drain contact for a semiconductor device.

In FIG. 2A, chip 202 may be carried by temporary chip-carrier 222. Chip 202 may be affixed temporarily to temporary chip-carrier 222. Temporary chip-carrier 222 may be configured to temporarily carry chip 202 from chip back side 206. In other words, chip back side 206 may be placed over temporary chip-carrier 222. Temporary chip-carrier 222 may include a semiconductor wafer. Temporary chip-carrier 222 may not be restricted by wafer size. Temporary chip-carrier 222 may include at least one from the following group of materials, the group consisting of glass, metal ceramic and plastic. Temporary chip-carrier 222 may be round or angled. A temporary chip-carrier may be removed during subsequent processes. A temporary chip-carrier may not form a part of the final product, i.e. the temporary chip-carrier may not form part of the final chip-package.

Figure 2B:
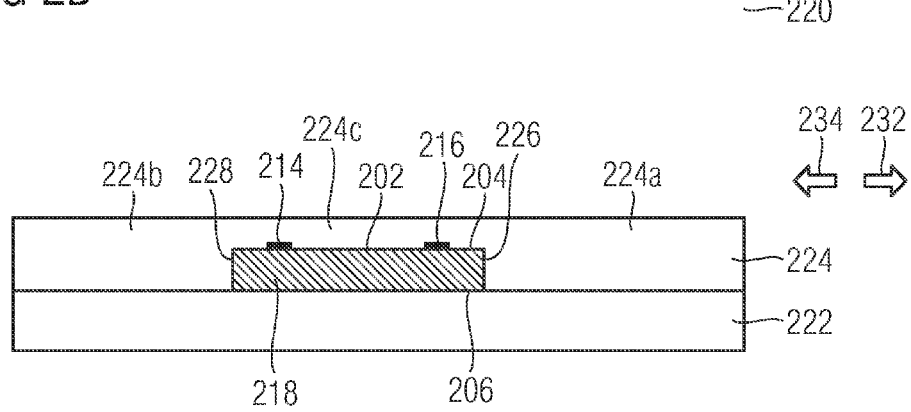

In FIG. 2B, insulation material 224 may be formed over one or more sides of chip 202. Insulation material 224 may be configured to surround chip front side 204, first chip lateral side 226 and second chip lateral side 228.

Forming insulation material 224 may include forming a first insulation portion 224a over first chip lateral side 226; forming second insulation portion 224b over second chip lateral side 228; and forming third insulation portion 224c over at least part of chip front side 204. Insulation material 224 may include at least one from the following group of materials, the group consisting of: plastic, unfilled plastic, plastic filled with glass, plastic filled with ceramic, plastic filled with ceramic particles, plastic filled with glas fibres, plastic polymers, plastic polymer based on a thermoset, plastic polymer based on a thermoplast and a resin. First chip lateral side 226 and second chip lateral side 228 may each abut opposite edges of chip back side 206. First chip lateral side 226 may face a direction opposite to a direction which second chip lateral side 228 faces, e.g. first chip lateral side 226 may face direction 232 opposite to direction 234 which second chip lateral side 228 faces. First chip lateral side 226 and second chip lateral side 228 may each abut opposite edges of chip front side 204.

Figure 2C:
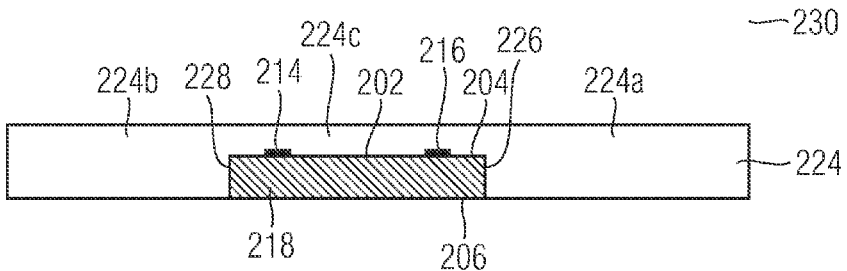

As shown in FIG. 2C, temporary chip-carrier 222 may be removed. Therefore, chip back side 206 may be released from temporary chip-carrier 222.

Figure 2D:
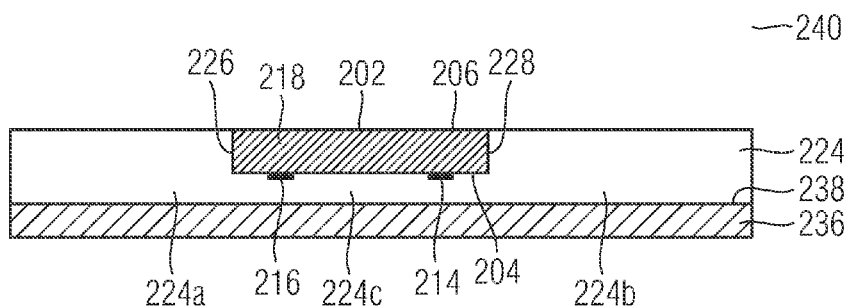

As shown in FIG. 2D, chip 202 may be placed temporarily over further temporary chip-carrier 236. Insulation material 224 may be placed over further temporary chip-carrier 236. Insulation material front side 238 may be placed over further temporary chip-carrier 236. In other words, chip front side 204 may face further temporary chip-carrier 236.

Figure 2E:
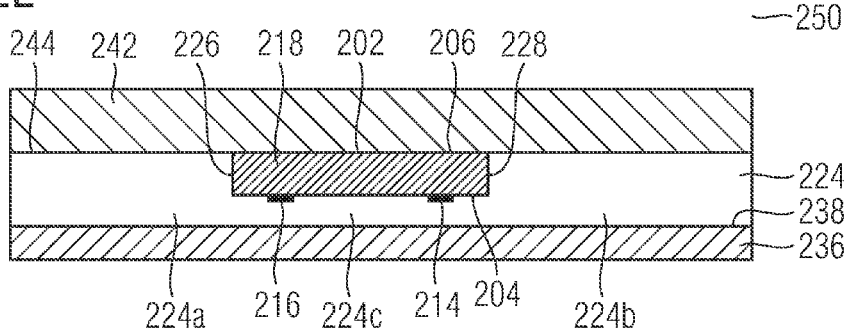

As shown in FIG. 2E, further insulation material 242 may be formed over chip back side 206 and over a part of insulation material 224, e.g. over a part of insulation material back side 244. Further insulation material 242 may be formed over chip back side 206 and a part of first insulation portion 224a. Further insulation material 242 may be formed over chip back side 206 and a part of second insulation portion 224b. Further insulation material 242 may include a photoresist. Further insulation material 242 may include at least one from the following group of materials, the group consisting of: plastic, unfilled plastic, plastic filled with glass, plastic filled with ceramic, plastic filled with ceramic particles, plastic filled with glas fibres, plastic polymers, plastic polymer based on a thermoset, plastic polymer based on a thermoplast and a resin.

Figure 2F:
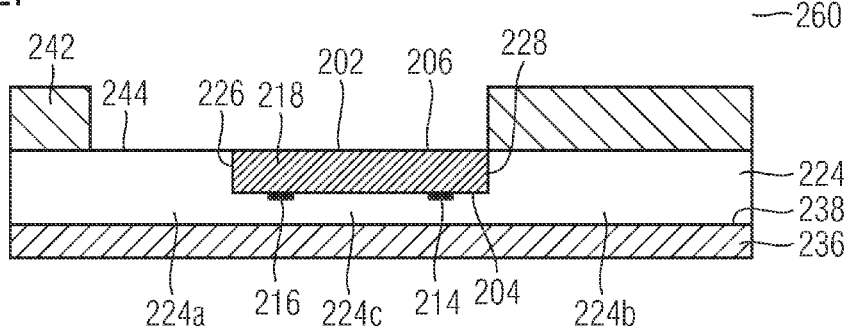

As shown in FIG. 2F, further insulation material 242 may be patterned, for example using photolithography, such that further insulation material 242 may be used as a deposition mask which protects some areas of insulation material 224 from a subsequent material deposition process, and exposes part of insulation material 224 and chip back side 206 to a subsequent material deposition process. A portion of further insulation material 242 may be removed to form a cavity in further insulation material 242, wherein chip back side 206 and part of first insulation portion 224a at insulation material back side 244 may be exposed.

As shown in FIG. 2G, chip-carrier 246 may be deposited over chip back side 206 and over part of first insulation portion 224a at insulation material back side 244.

Chip-carrier 246 may be deposited such that further insulation material 242 may be proximate to the chip-carrier 246, e.g. further insulation material 242 may be adjacent to chip-carrier sidewalls 248a, 248b.

Chip-carrier 246 may be deposited using a galvanic process. Chip-carrier 246 may be deposited by a printing paste process. Chip-carrier 246 may be deposited by a sputter process. Chip-carrier 246 may be deposited by a plasma dust deposition process. Chip-carrier 246 may be deposited by a semi-additive process. A semi-additive process may include a deposition process wherein chip-carrier 246, e.g. an electrically conductive layer may be placed, e.g. deposited, at specific positions, e.g. over chip back side 206, and over a small area beside the chip back side 206. A electrically conductive layer may not be applied to fully cover the embedded side, i.e. entire chip back side 206, and insulation material back side 244. Chip 202 may thereby be arranged over chip-carrier side 252, i.e. a side of chip-carrier 246, wherein chip-carrier side 252 may be in electrical connection with a chip back side 206, e.g. chip-carrier side 252 may be in electrical connection with electrical contact 218 formed over chip back side 206. According to an alternative embodiment, chip-carrier 246 may include part of electrical contact 218. According to an alternative embodiment, chip-carrier 246 may include a chip back side drain contact for a semiconductor device.

Chip-carrier 246 may include at least one from the following group of materials, the group consisting of: tin, lead, silver, copper, nickel, zinc, aluminum, gold, antimony, inorganic elements and organic elements. Chip-carrier 246 may include an alloy including at least one from the group of materials, including small amounts of at least one of the inorganic elements and organic elements. Chip-carrier 246 may have a thickness ranging from about 1 µm to about 400 µm, e.g. from about 100 µm to about 300 µm, e.g. from about 150 µm to about 250 µm. The thicker the chip-carrier 246, the more heat can be stored by running of the device. Chip-carrier 246 may function as a heat sink. The thickness of chip-carrier 246, i.e the electrically conductive layer, may be limited due to a relatively slow galvanic growth process. For layers thicker than 50 µm, print processes, e.g. stencil prints, e.g. screen prints, or the use of conductive pastes may be used. Print processes may be used if galvanic growth processes are too slow, or uneconomical. Chip-carrier 246 for the chip-package design described herein, may replace a leadframe substrate usually made out of copper and with a thickness of approximately 250 µm. Therefore, chip-carrier 246 may include an electrically conductive layer having a preferred thickness ranging from 100 µm to 250 µm. Chip-carrier 246 may include an electrically conductive material. Chip-carrier 246 may include an electrically conductive material deposited over chip back side 206 by a semi-additive process.

Chip 202 may thereby be arranged over chip-carrier side 252, wherein at least part of chip-carrier 246 may extend in a direction perpendicular to the first chip lateral side 226 further than chip 202.

Chip 202 may thereby be arranged over chip-carrier side 252, wherein at least part of first insulation portion 224a may be arranged over chip-carrier side 252 wherein first insulation portion 224a extends in a direction perpendicular to the first chip lateral side 226 further than chip-carrier 246. First insulation portion 224a may include a portion X arranged over chip-carrier side 252, and an extension portion Y that is arranged adjacent to portion X and opposite to first chip lateral side 226, such that first insulation portion 224a extends in a direction perpendicular to first chip lateral side 226 further than chip-carrier 246. Extension portion Y may be arranged such that extension portion Y is not arranged over chip-carrier side 252, therefore, first insulation portion 224a extends in a direction perpendicular to first chip lateral side 226 away from first chip lateral side 226, i.e. away from chip 202, further than chip-carrier 246. Extension portion Y may be a portion of first insulation portion 224a, wherein extension portion Y is the portion of first insulation portion 224a that extends in a direction perpendicular to first chip lateral side 226 further than chip-carrier 246.

According to various embodiments, chip 202 may thereby be arranged over chip-carrier side 252, wherein at least part of chip-carrier 246 may not extend in a direction perpendicular to the first chip lateral side 226 further than chip 202, e.g. chip-carrier lateral sides 248a, 248b, may each be substantially aligned with chip lateral sides 226, 228; or, chip 202 may extend in a direction perpendicular to the first chip lateral side 226 further than chip-carrier 246. Accordingly, first insulation portion 224a may not include a portion X arranged over chip-carrier side 252, but extension portion Y, wherein extension portion Y is the portion that extends in a direction perpendicular to first chip lateral side 226 further than chip-carrier 246.

Further insulation material 242 may be configured proximate to chip-carrier 246. Further insulation material 242 may be formed over a part of first insulation portion 224a which extends in a direction perpendicular to first chip lateral side 226 further than chip-carrier 246. Further insulation material 242 may be formed over a part of first insulation portion 224a, e.g. extension portion Y of first insulation portion 224a, wherein extension portion Y may be arranged such that first insulation portion 224a extends in a direction perpendicular to first chip lateral side 226 further than chip-carrier 246.

Second insulation portion 224b may extend in a direction perpendicular to second chip lateral side 228 further than chip-carrier 246. Second insulation portion 224b may be arranged such that second insulation portion 224b may or may not be arranged over chip-carrier side 252. Second insulation portion 224b may extend in a direction perpendicular to second chip lateral side 228 away from second chip lateral side 228, i.e. away from chip 202, further than chip-carrier 246.

Further insulation material 242 may be configured proximate to chip-carrier 246. Further insulation material 242 may be formed over a part of second insulation portion 224b, which extends in a direction perpendicular to second chip lateral side 228 further than chip-carrier 246. Further insulation material 242 may be formed over a part of second insulation portion 224b from insulation material back side 244.

Further temporary chip-carrier 236 may be removed.

As shown in FIG. 2H, a laser process may be carried out to form one or more through-holes 254, 256, 258 through insulation material 224. One or more through-holes 254, 256 may extend substantially vertically away from first chip side 204 through insulation material 224. One or more through-holes 254, 256 may extend substantially vertically away from first chip side 204 through third insulation portion 224c. Through-hole 254 may be configured to expose electrical contact 214. Through-hole 256 may be configured to expose electrical contact 216. Through-hole 258 may extend vertically away from chip-carrier side 252 through insulation material 224. Through-hole 258 may extend vertically away from chip-carrier side 252 through first insulation portion 224a. Through-hole 258 may extend vertically away from chip-carrier side 252 through portion X of first insulation portion 224a.

As shown in FIG. 2I, a deposition process may be carried out to form one or more electrical interconnects 262, 264 in through-holes 254, 256, and further electrical interconnect 266 in through-hole 258. One or more electrical interconnects 262, 264, 266 may be formed by filling through-holes 254, 256, 258 with an electrically conductive material, e.g. tin, lead, silver, copper, nickel, zinc, aluminum, gold, antimony, inorganic elements and organic elements. Chip-carrier 246 may include an alloy including at least one from the group of materials, including small amounts of at least one of the inorganic elements and organic elements.

One or more electrical interconnects 262, 264 may be configured to be in electrical connection with one or more electrical contacts 214, 216 formed over chip first side 204, e.g. electrical interconnect 262 may be configured to be in electrical connection with electrical contact 214, e.g. electrical interconnect 264 may be configured to be in electrical connection with electrical contact 216. Further electrical interconnect 266 may be configured to be in electrical connection with chip-carrier side 252. Further electrical interconnect 266 may be configured to extend substantially vertically away from chip-carrier side 252, through insulation material 224. Further electrical interconnect 266 may be configured to extend substantially vertically away from chip-carrier side 252, through first insulation portion 224a, e.g. through portion X of first insulation portion 224a.

Insulation material 224 may be configured to electrically insulate one or more electrical interconnects 262, 264 in electrical connection with one or more electrical contacts 214, 216, wherein one or more electrical interconnects 262, 264 may be configured to extend substantially vertically away from chip front side 204, through third insulation portion 224c.

Figure 2J:
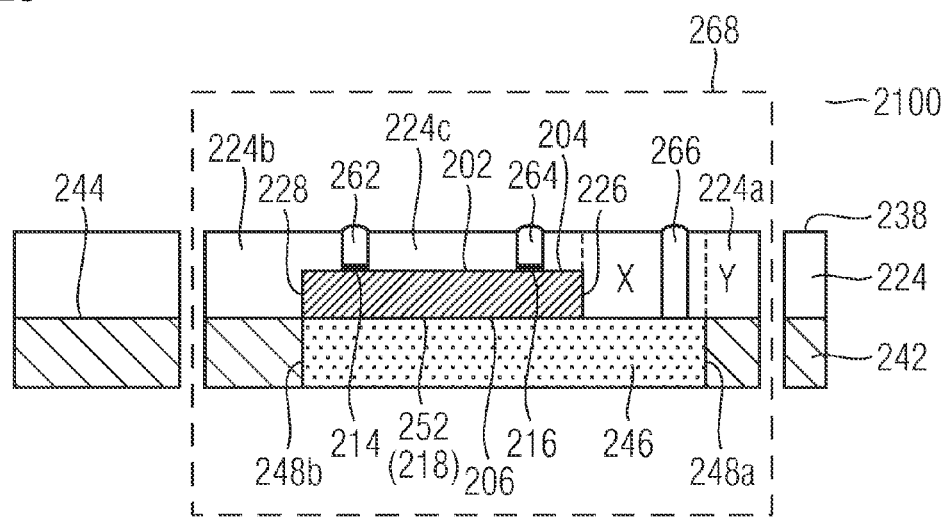

As shown in FIG. 2J, chip-package 268 may be individualized by separating, e.g. dicing, through insulation material 224 and further insulation material 242. Chip-package 268 may be individualized by separating, e.g. dicing, through first insulation portion 224a. Chip-package 268 may be individualized by separating, e.g. dicing, through extension portion Y of first insulation portion 224a. Chip-package 268 may be individualized by separating, e.g. dicing, through extension portion Y of first insulation portion 224a and further insulation material 242. Chip-package 268 may be individualized by separating, e.g. dicing, through second insulation portion 224b and further insulation material 242. In other words, chip-package 268 may be individualized without dicing through chip-carrier 246. Wherein first insulation material 224 and further insulation material 242 may be formed from the same material, chip-package 268 may be individualized by separating, e.g. dicing, through a single type of material. Chip-package 268 according to an embodiment is provided.

Figure 2K:
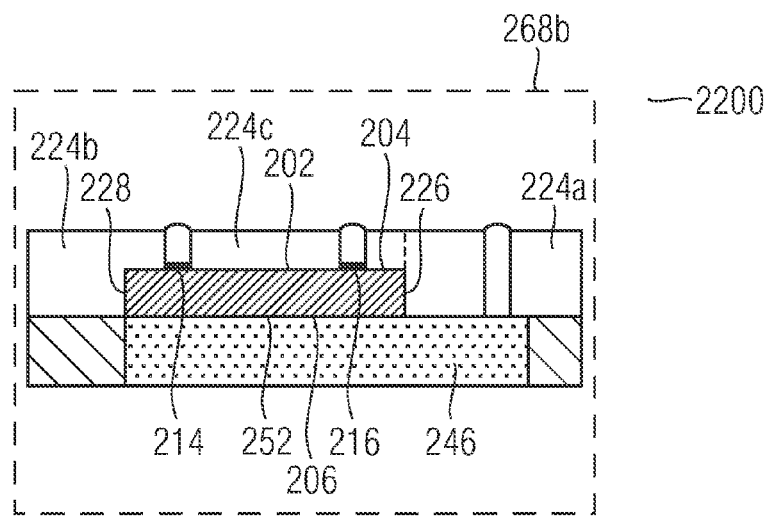
FIG. 2K provides a chip-package according to an embodiment.

As shown in FIG. 2K, chip-package 268a according to an embodiment is provided, wherein chip-package 268a may include: a chip-carrier 246 configured to carry chip 202, chip 202 arranged over a chip-carrier side 252, wherein chip-carrier side 252 is configured to be in electrical connection with chip back side 218; insulation material 224 including: first insulation portion 224a formed over first chip lateral side 226; second insulation portion 224b formed over second chip lateral side 228, wherein first chip lateral side 226 and second chip lateral side 228 each abuts opposite edges of the chip back side 218; and third insulation portion 224c formed over at least part of chip front side 204, chip front side 204 including one or more electrical contacts 214, 216 formed within chip front side 204; wherein at least part of first insulation portion 224a is arranged over chip-carrier side 252 and wherein first insulation portion 224a is configured to extend in a direction perpendicular to first chip lateral side 226 further than chip-carrier 246.

Method 200 described according to various embodiments eliminates the need for typical leadframe carriers. Such leadframe carriers may include copper leadframe carriers, with or without surface plating by at least one of nickel and silver. Such leadframe carriers may include a thickness of approximately 250 μm. Therefore, leadframe carrier materials may be saved. As typical die attach processes such as diffusion soldering, e.g. adhesive depositions, e.g. gluing, for attaching a chip to a leadframe may be eliminated, materials spent on typical die attach processes may be saved. Furthermore, sawing through a leadframe, which is typically a challenging process in conventional package dicing processes, may be eliminated, as separation may be carried out solely through the insulation material, without sawing through the chip-carrier.

FIGS. 3A to 3G show a method 300 for forming a chip-package according to an embodiment.

Method 300 may be carried out according to FIGS. 2A to 2E of method 200 already described above. The basic functionalities of all the features described with respect to method 200 are applicable to method 300.

As shown in FIG. 3A, further insulation material 242 may be formed over chip back side 206 and over a part of insulation material 224, e.g. over a part of insulation material back side 244 as shown in FIG. 2E. Further insulation material 242 may be formed over chip back side 206 and a part of first insulation portion 224a, e.g. further insulation material 242 may be formed over chip back side 206 and a part of second insulation portion 224b as shown in FIG. 2E.

Subsequently, as shown in FIG. 3B, a laser process may be carried out to form one or more through-holes 254, 256, 258 through insulation material 224. One or more through-holes 254, 256 may extend substantially vertically away from first chip side 204 through insulation material 224. One or more through-holes 254, 256 may extend substantially vertically away from first chip side 204 through third insulation portion 224c. Through-hole 254 may be configured to expose electrical contact 214. Through-hole 256 may be configured to expose electrical contact 216. Through-hole 258 may extend vertically away from chip-carrier side 252 through insulation material 224. Through-hole 258 may extend vertically away from chip-carrier side 252 through first insulation portion 224a.

As shown in FIG. 3C, chip 202 may be placed temporarily over further temporary chip-carrier 372. Insulation material 224 may be placed over further temporary chip-carrier 372. Insulation material front side 238 may be placed over further temporary chip-carrier 372. In other words, chip front side 204 may face further temporary chip-carrier 372.

Further insulation material 242 may be patterned, for example using photolithography, such that further insulation material 242 may be used as a deposition mask which protects some areas of insulation material 224 from a subsequent material deposition process, and exposes part of insulation material 224 and chip back side 206 to a subsequent material deposition process. A portion of further insulation material 242 may be removed to form cavity 374 in further insulation material 242, wherein chip back side 206 and part of first insulation portion 224a at insulation material back side 244 may be exposed. Cavity 374 may be formed in further insulation material such that cavity 374 extends in a direction perpendicular to the first chip lateral side 226 further than through-hole 258.

Cavity 374 may be formed in further insulation material such that cavity 374 extends in a direction perpendicular to the first chip lateral side 226 further than chip 202.

At least part of first insulation portion 224a may be arranged wherein first insulation portion 224a extends in a direction perpendicular to the first chip lateral side 226 further than cavity 374.

First insulation portion 224a may therefore include a portion X arranged over cavity 374, and an extension portion Y that is arranged adjacent to portion X and opposite to first chip lateral side 226, such that first insulation portion 224a extends in a direction perpendicular to first chip lateral side 226 further than cavity 374. Extension portion Y may be arranged such that extension portion Y is not arranged over cavity 374, therefore, first insulation portion 224a extends in a direction perpendicular to first chip lateral side 226 away from first chip lateral side 226, i.e. away from chip 202, further than cavity 374. Extension portion Y may be a portion of first insulation portion 224a, wherein extension portion Y is the portion of first insulation portion 224a that extends in a direction perpendicular to first chip lateral side 226 further than cavity 374.

According to an alternative embodiments, cavity 374 may be formed in further insulation material such that cavity 374 does not extend in a direction perpendicular to the first chip lateral side 226 further than chip 202. For example, width of cavity 374 may be aligned with first chip lateral side 226 and second chip lateral side 228, or, chip 202 may extend in a direction perpendicular to the first chip lateral side 226 further than cavity 374.

At least part of first insulation portion 224a may be arranged wherein first insulation portion 224a extends in a direction perpendicular to the first chip lateral side 226 further than cavity 374.

First insulation portion 224a may therefore not include a portion X arranged over cavity 374, but an extension portion Y, wherein extension portion Y may be arranged such that extension portion Y is not arranged over cavity 374. Extension portion Y may be a portion of first insulation portion 224a, wherein extension portion Y is the portion of first insulation portion 224a that extends in a direction perpendicular to first chip lateral side 226 further than cavity 374.

As shown in FIG. 3D, further temporary chip-carrier 374 may subsequently be removed.

As shown in FIG. 3E, chip-carrier 246, one or more electrical interconnects 262, 264, and further electrical interconnect 266 may be formed in a single process. A single deposition process, e.g. a double-sided galvanic process, may be carried out to deposit chip-carrier 246, one or more electrical interconnects 262, 264, and further electrical interconnect 266 simultaneously. Chip-carrier 246 may include a chip back side drain contact, e.g. electrical contact 218, for a semiconductor device.

Chip 202 may thereby be arranged over chip-carrier side 252, wherein chip-carrier side 252 may be in electrical connection with a chip back side 206, e.g. with electrical contact 218 formed over chip back side 206. Chip-carrier 246 may include at least one from the following group of materials, the group consisting of: tin, lead, silver, copper, nickel, zinc, aluminum, gold, antimony, inorganic elements and organic elements. Chip-carrier 246 may include an alloy including at least one from the group of materials, including small amounts of at least one of the inorganic elements and organic elements.

Chip-carrier 246 may have a thickness ranging from about 1 μm to about 400 μm, e.g. from about 100 μm to about 300 μm, e.g. from about 150 μm to about 250 μm. Chip-carrier 246 may include an electrically conductive material. Chip-carrier 246 may include an electrically conductive material deposited over chip back side 206 by a semi-additive process.

Chip-carrier 246 may be deposited such that further insulation material 242 may be proximate to chip-carrier 246, e.g. further insulation material 242 may be adjacent to chip-carrier sidewalls 248a, 248b. Chip 202 may thereby be arranged over chip-carrier side 252, wherein chip-carrier side 252 may be in electrical connection with a chip back side 206, e.g. with electrical contact 218 formed over chip back side 206.

Chip 202 may thereby be arranged over chip-carrier side 252, wherein at least part of first insulation portion 224a may be arranged over chip-carrier side 252 wherein first insulation portion 224a extends in a direction perpendicular to the first chip lateral side 226 further than chip-carrier 246. First insulation portion 224a may therefore include a portion X arranged over chip-carrier side 252, and an extension portion Y that is arranged adjacent to portion X and opposite to first chip lateral side 226, such that first insulation portion 224a extends in a direction perpendicular to first chip lateral side 226 further than chip-carrier 246. Extension portion Y may be arranged such that extension portion Y is not arranged over chip-carrier side 252, therefore, first insulation portion 224a extends in a direction perpendicular to first chip lateral side 226 away from first chip lateral side 226, i.e. away from chip 202, further than chip-carrier 246.

According to various embodiments, wherein cavity 374 may have be formed in further insulation material such that cavity 374 does not extend in a direction perpendicular to the first chip lateral side 226 further than chip 202, for example, width of cavity 374 may be aligned with first chip lateral side 226 and second chip lateral side 228 or, chip 202 may extend in a direction perpendicular to the first chip lateral side 226 further than cavity 374; then chip 202 may thereby be arranged over chip-carrier side 252, wherein at least part of chip-carrier 246 may not extend in a direction perpendicular to the first chip lateral side 226 further than chip 202, e.g. chip-carrier lateral sides 248a, 248b, may each be substantially aligned with chip lateral sides 226, 228; or, chip 202 may extend in a direction perpendicular to the first chip lateral side 226 further than chip-carrier 246.

Accordingly, first insulation portion 224a may not include a portion X arranged over chip-carrier side 252, but extension portion Y, wherein extension portion Y is the portion that extends in a direction perpendicular to first chip lateral side 226 further than chip-carrier 246.

Further insulation material 242 may be formed over a part of first insulation portion 224a which extends in a direction perpendicular to first chip lateral side 226 further than chip-carrier 246. Further insulation material 242 may be formed over a part of first insulation portion 224a, e.g. extension portion Y of first insulation portion 224a, wherein extension portion Y may be arranged such that first insulation portion 224a extends in a direction perpendicular to first chip lateral side 226 further than chip-carrier 246.

Second insulation portion 224b may extend in a direction perpendicular to second chip lateral side 228 further than chip-carrier 246. Second insulation portion 224b may be arranged such that second insulation portion 224b may or may not be arranged over chip-carrier side 252. Second insulation portion 224b may extend in a direction perpendicular to second chip lateral side 228 away from second chip lateral side 228, i.e. away from chip 202, further than chip-carrier 246.

Further insulation material 242 may be configured proximate to chip-carrier 246. Further insulation material 242 may be formed over a part of second insulation portion 224b which extends in a direction perpendicular to second chip lateral side 228 further than chip-carrier 246.

One or more electrical interconnects 262, 264 may be formed in through-holes 254, 256, and further electrical interconnect 266 in through-hole 258. One or more electrical interconnects 262, 264, 266 may be formed by filling through-holes 254, 256, 258 with an electrically conductive material, e.g. tin, lead, silver, copper, nickel, zinc, aluminum, gold, antimony, inorganic elements and organic elements. One or more electrical interconnects 262, 264, 266 may include an alloy including at least one from the group of materials, including small amounts of at least one of the inorganic elements and organic elements.

One or more electrical interconnects 262, 264 may be configured to be in electrical connection with one or more electrical contacts 214, 216 formed over chip first side 204 formed over chip first side 204, e.g. electrical interconnect 262 may be configured to be in electrical connection with electrical contact 216, e.g. e.g. electrical interconnect 264 may be configured to be in electrical connection with electrical contact 214. Further electrical interconnect 266 may be configured to be in electrical connection with the chip-carrier side 252. Further electrical interconnect 266 may be configured to extend substantially vertically away from chip-carrier side 252, through insulation material 224. Further electrical interconnect 266 may be configured to extend substantially vertically away from chip-carrier side 252, through first insulation portion 224a.

Insulation material 224 may be configured to electrically insulate one or more electrical interconnects 262, 264 in electrical connection with one or more electrical contacts 214, 216, wherein one or more electrical interconnects 262, 264 may be configured to extend substantially vertically away from chip front side 204, through third insulation portion 224c.

As shown in FIG. 3F, further insulation material 242 may be removed, e.g. by stripping, e.g. by dissolving, e.g. by etching.

As shown in FIG. 3G, chip-package 368 may be individualized by separating, e.g. dicing, through insulation material 224. Chip-package 368 may be individualized by separating, e.g. dicing, through first insulation portion 224a. Chip-package 368 may be individualized by separating, e.g. dicing, through extension portion Y of first insulation portion 224a. Chip-package 368 may be individualized by separating, e.g. dicing, through second insulation portion 224b. In other words, chip-package 368 may be individualized without dicing through chip-carrier 246, therefore chip-package 368 may be individualized by separating, e.g. dicing, through a single type of material.

In addition to the saving leadframe materials and die attach materials, the method according to the embodiment increases process efficiency by depositing front side contacts, i.e. electrical interconnects 262, 264, 266 and chip-carrier 246 over chip back side 206 simultaneously.

Chip-package 368 is therefore provided, wherein chip-package 368 may include: a chip-carrier 246 configured to carry chip 202, chip 202 arranged over a chip-carrier side 252, wherein chip-carrier side 252 is configured to be in electrical connection with chip back side 218; insulation material 224 including: first insulation portion 224a formed over first chip lateral side 226; second insulation portion 224b formed over second chip lateral side 228, wherein first chip lateral side 226 and second chip lateral side 228 each abuts opposite edges of the chip back side 218; and third insulation portion 224c formed over at least part of chip front side 204, chip front side 204 including one or more electrical contacts 214, 216 formed within chip front side 204; wherein at least part of first insulation portion 224a is arranged over chip-carrier side 252 and wherein first insulation portion 224a is configured to extend in a direction perpendicular to first chip lateral side 226 further than chip-carrier 246.

FIGS. 4A to 4D show method 400 for forming a chip-package according to an embodiment.

Method 400 may be carried out according to FIGS. 2A to 2E of method 200 already described above. The basic functionalities of all the features described with respect to methods 200, 300 are applicable to method 400.

As shown in FIG. 4A, further insulation material 242 may be formed over chip back side 206 and over a part of insulation material 224, e.g. over a part of insulation material back side 244. Further insulation material 242 may be formed over chip back side 206 and a part of first insulation portion 224a, e.g. further insulation material 242 may be formed over chip back side 206 and a part of second insulation portion 224b.

Second further insulation material 476 may be formed over chip front side 204 and over a part of insulation material 224, e.g. over a part of insulation material front side 238. Second further insulation material 476 may be formed over chip front side 204, e.g. over a part of first insulation portion 224a, e.g. over a part of second insulation portion 224b, e.g. over a part of third insulation portion 224c.

Second further insulation material 476 may include a photoresist. Second further insulation material 476 may include at least one from the following group of materials, the group consisting of: plastic, unfilled plastic, plastic filled with glass, plastic filled with ceramic, plastic filled with ceramic particles, plastic filled with glas fibres, plastic polymers, plastic polymer based on a thermoset, plastic polymer based on a thermoplast and a resin.

Further insulation material 242 and second further insulation material 476 may be patterned, for example using photolithography.

Further insulation material 242 may be patterned such that further insulation material 242 may form a deposition mask which protects some areas of insulation material 224 from a subsequent material deposition process, while exposing part of insulation material 224 and chip back side 206 to a subsequent material deposition process. A portion of further insulation material 242 may be removed to form cavity 474 in further insulation material 242, wherein chip back side 206 and part of first insulation portion 224a at insulation material back side 244 may be exposed. Cavity 474 may be formed in further insulation material such that cavity 472 extends in a direction perpendicular to the first chip lateral side 226 further than first chip lateral side 226. At least part of first insulation portion 224a may be arranged wherein first insulation portion 224a extends in a direction perpendicular to the first chip lateral side 226 further than cavity 474.

First insulation portion 224a may therefore include a portion X arranged over cavity 474, and an extension portion Y that is arranged adjacent to portion X and opposite to first chip lateral side 226, such that first insulation portion 224a extends in a direction perpendicular to first chip lateral side 226 further than cavity 474. Extension portion Y may be arranged such that extension portion Y is not arranged over cavity 474, therefore, first insulation portion 224a extends in a direction perpendicular to first chip lateral side 226 away from first chip lateral side 226, i.e. away from chip 202, further than cavity 474. Extension portion Y may be a portion of first insulation portion 224a, wherein extension portion Y is the portion of first insulation portion 224a, that extends in a direction perpendicular to first chip lateral side 226 further than chip-carrier 246. The features described above with respect to cavity 374 may apply to cavity 474.

Second further insulation material 476 may be patterned such that second further insulation material 476 may form a deposition mask which protects some areas of insulation material 224 from a subsequent material deposition process, while exposing part of insulation material 224 to a subsequent material deposition process. Second further insulation material 476 may be patterned such that second further insulation material 476 may form a deposition mask which protects some areas of insulation material 224 at insulation material front side 238, from a subsequent material deposition process, while exposing part of insulation material 224 at insulation material front side 238, to a subsequent material deposition process.

A portion of second further insulation material 476 may be removed to form one or more cavities 478, 482, 484 in second further insulation material 242. One or more cavities 478, 482 may be formed over one or more electrical contacts 214, 216, e.g. cavity 478 may be formed over electrical contact 214, and cavity 482 may be formed over electrical contact 216. One or more cavities 478, 482 may each be formed wider than each electrical contact 214, 216. Cavity 484 may be formed over first insulation portion 224a of insulation material 224.

As shown in FIG. 4C, a laser process may be carried out to form one or more through-holes 254, 256, 258 through insulation material 224. One or more through-holes 254, 256, 258 may be formed by treating insulation material 224 through the one or more cavities 478, 482, 484 formed in second further insulation material 242, which exposes insulation material front side 238 to the laser process.

One or more through-holes 254, 256 may extend substantially vertically away from first chip side 204 through insulation material 224. One or more through-holes 254, 256 may extend substantially vertically away from first chip side 204 through third insulation portion 224c. Through-hole 254 may be configured to expose electrical contact 214. Through-hole 256 may be configured to expose electrical contact 216. Through-hole 258 may extend vertically away from chip-carrier side 252 through insulation material 224. Through-hole 258 may extend vertically completely through first insulation portion 224a, e.g. between insulation material front side 238 to insulation material back side 244.

As shown in FIG. 4D, chip-carrier 246, one or more electrical interconnects 462, 464, and further electrical interconnect 466 may be formed. Chip-carrier 246, one or more electrical interconnects 462, 464, and further electrical interconnect 466 may be formed in single deposition process, or in separate deposition processes.

A single deposition process, e.g. a double-sided galvanic process, may be carried out to deposit chip-carrier 246, one or more electrical interconnects 462, 464, and further electrical interconnect 466 simultaneously.

Chip-carrier 246 may be deposited such that further insulation material 242 may be proximate to chip-carrier 246, e.g. further insulation material 242 may be adjacent to chip-carrier sidewalls 248a, 248b. Chip 202 may thereby be arranged over chip-carrier side 252, wherein chip-carrier side 252 may be in electrical connection with a chip back side 206, e.g. with electrical contact 218 formed over chip back side 206.

Chip 202 may thereby be arranged over chip-carrier side 252, wherein chip-carrier side 252 may be in electrical connection with a chip back side 206, e.g. with electrical contact 218 formed over chip back side 206. Chip-carrier 246 may include at least one from the following group of materials, the group consisting of: tin, lead, silver, copper, nickel, zinc, aluminum, gold, antimony, inorganic elements and organic elements. Chip-carrier 246 may include an alloy including at least one from the group of materials, including small amounts of at least one of the inorganic elements and organic elements.

Chip-carrier 246 may have a thickness ranging from about 1 µm to about 400 µm, e.g. from about 100 µm to about 300 µm, e.g. from about 150 µm to about 250 µm. Chip-carrier 246 may include an electrically conductive material. Chip-carrier 246 may include an electrically conductive material deposited over chip back side 206 by a semi-additive process.

Chip 202 may thereby be arranged over chip-carrier side 252, wherein at least part of chip-carrier 246 may extend in a direction perpendicular to the first chip lateral side 226 further than chip 202.

Chip 202 may thereby be arranged over chip-carrier side 252, wherein at least part of first insulation portion 224a may be arranged over chip-carrier side 252 wherein first insulation portion 224a extends in a direction perpendicular to the first chip lateral side 226 further than chip-carrier 246. First insulation portion 224a may therefore include a portion X arranged over chip-carrier side 252, and an extension portion Y that is arranged adjacent to portion X and opposite to first chip lateral side 226, such that first insulation portion 224a extends in a direction perpendicular to first chip lateral side 226 further than chip-carrier 246. Extension portion Y may be arranged such that extension portion Y is not arranged over chip-carrier side 252, therefore, first insulation portion 224a extends in a direction perpendicular to first chip lateral side 226 away from first chip lateral side 226, i.e. away from chip 202, further than chip-carrier 246. Extension portion Y may be a portion of first insulation portion 224, wherein extension portion Y is the portion that extends in a direction perpendicular to first chip lateral side 226 further than chip-carrier 246.

According to various embodiments, chip 202 may thereby be arranged over chip-carrier side 252, wherein at least part of chip-carrier 246 may not extend in a direction perpendicular to the first chip lateral side 226 further than chip 202, e.g. chip-carrier lateral sides 248a, 248b, may each be substantially aligned with chip lateral sides 226, 228; or, chip 202 may extend in a direction perpendicular to the first chip lateral side 226 further than chip-carrier 246. Accordingly, first insulation portion 224a may not include a portion X arranged over chip-carrier side 252, but extension portion Y, wherein extension portion Y is the portion that extends in a direction perpendicular to first chip lateral side 226 further than chip-carrier 246.

Second insulation portion 224b may extend in a direction perpendicular to second chip lateral side 228 further than chip-carrier 246. Second insulation portion 224b may be arranged such that second insulation portion 224b may or may not be arranged over chip-carrier side 252. Second insulation portion 224b may extend in a direction perpendicular to second chip lateral side 228 away from second chip lateral side 228, i.e. away from chip 202, further than chip-carrier 246.

One or more electrical interconnects 462, 464 may be formed in through-holes 254, 256, and further electrical interconnect 466 in through-hole 258. One or more electrical interconnects 462, 464, 466 may be formed by filling through-holes 254, 256, 258 with an electrically conductive material, e.g. tin, lead, silver, copper, nickel, zinc, aluminum, gold, antimony, inorganic elements and organic elements. Chip-carrier 246 may include an alloy including at least one from the group of materials, including small amounts of at least one of the inorganic elements and organic elements.

One or more electrical interconnects 462, 464 may be configured to be in electrical connection with one or more electrical contacts 214, 216 formed over chip first side 204 formed over chip first side 204, e.g. electrical interconnect 462 may be configured to be in electrical connection with electrical contact 216, e.g. e.g. electrical interconnect 464 may be configured to be in electrical connection with electrical contact 214. Further electrical interconnect 466 may be configured to be in electrical connection with the chip-carrier side 252. Further electrical interconnect 466 may be configured to extend substantially vertically away from chip-carrier side 252, through insulation material 224. Further electrical interconnect 466 may be configured to extend substantially vertically away from chip-carrier side 252, through first insulation portion 224a.

One or more cavities 478, 482, 484 may be filled with an electrically conductive material, e.g. copper. One or more cavities 478, 482, 484 may be filled with an electrically conductive material from one or more electrical interconnects 462, 464, 466. One or more electrical interconnects 462, 464, 466 may include one or more electrical contact pads formed in one or more cavities 478, 482, 484, over insulation material front side 238.

Insulation material 224 may be configured to electrically insulate one or more electrical interconnects 462, 464 in electrical connection with one or more electrical contacts 214, 216, wherein one or more electrical interconnects 462, 464 may be configured to extend substantially vertically away from chip front side 204, through third insulation portion 224c. Insulation material 224 may be configured to electrically insulate further electrical interconnects 466, in electrical connection with chip-carrier side 252, from one or more electrical interconnects 462, 464 in electrical connection with one or more electrical contacts 214, 216. Further electrical interconnects 466 may be configured to extend substantially vertically away from chip-carrier side 252 through first insulation portion 224b.

Further insulation material 242 and second further insulation material 476 may be removed, e.g. by stripping, e.g. by dissolving, e.g. by etching.

Chip-package 468 may be individualized by separating, e.g. dicing, through insulation material 224. Chip-package 468 may be individualized by separating, e.g. dicing, through first insulation portion 224a. Chip-package 468 may be individualized by separating, e.g. dicing, through extension portion Y of first insulation portion 224a. Chip-package 468 may be individualized by separating, e.g. dicing, through second insulation portion 224b. In other words, chip-package 468 may be individualized without dicing through chip-carrier 246, therefore chip-package 468 may be individualized by separating, e.g. dicing, through a single type of material.

Chip-package 468 is therefore provided, wherein chip-package 468 may include: a chip-carrier 246 configured to carry chip 202, chip 202 arranged over a chip-carrier side 252, wherein chip-carrier side 252 is configured to be in electrical connection with chip back side 218; insulation material 224 including: first insulation portion 224a formed over first chip lateral side 226; second insulation portion 224b formed over second chip lateral side 228, wherein first chip lateral side 226 and second chip lateral side 228 each abuts opposite edges of the chip back side 218; and third insulation portion 224c formed over at least part of chip front side 204, chip front side 204 including one or more electrical contacts 214, 216 formed within chip front side 204; wherein at least part of first insulation portion 224a is arranged over chip-carrier side 252 and wherein first insulation portion 224a is configured to extend in a direction perpendicular to first chip lateral side 226 further than chip-carrier 246.

According to various embodiments, method 500 for forming a chip-package may be carried out as described according to FIGS. 4A to 4D. Method 500 differs from method 400 only in that further insulation material 242 and second further insulation material 476 may not be removed during the process as described in FIG. 4D.

Figure 5A:
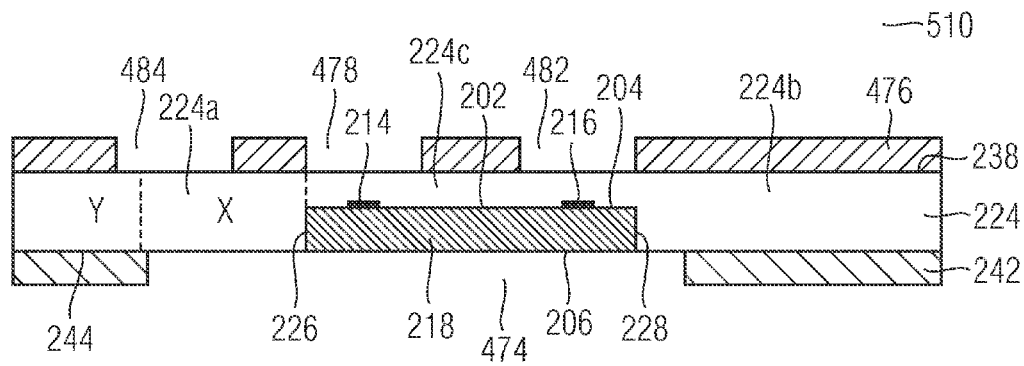
FIGS. 5A and 5B provide a method for forming a chip-package according to an embodiment, FIG. 5B provides a chip-package according to an embodiment.
Figure 5B:
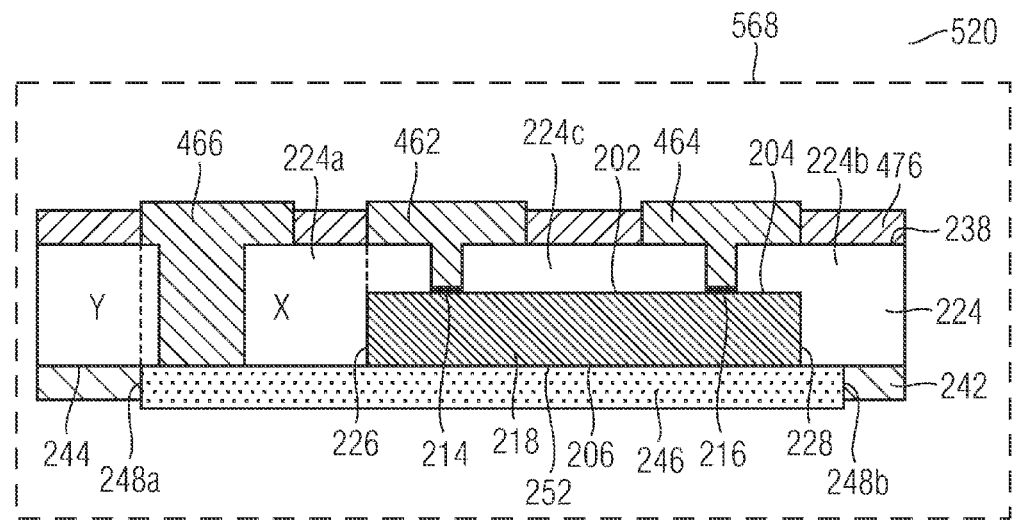

Therefore, as shown in FIG. 5B, chip-package 568 may be individualized by separating, e.g. dicing, through insulation material 224, further insulation material 242 and second further insulation material 476. Chip-package 568 may be individualized by separating, e.g. dicing, through first insulation portion 224a, further insulation material 242 and second further insulation material 476. Chip-package 568 may be individualized by separating, e.g. dicing, through extension portion Y of first insulation portion 224a, further insulation material 242 and second further insulation material 476. Chip-package 568 may be individualized by separating, e.g. dicing, through second insulation portion 224b, further insulation material 242 and second further insulation material 476. In other words, chip-package 568 may be individualized without dicing through chip-carrier 246. Wherein first insulation material 224 and further insulation material 242 and second further insulation material 476 may be formed from the same material, chip-package 568 may be individualized by separating, e.g. dicing, through a single type of material.

Chip-package 568 is therefore provided, wherein chip-package 568 may include: a chip-carrier 246 configured to carry chip 202, chip 202 arranged over a chip-carrier side 252, wherein chip-carrier side 252 is configured to be in electrical connection with chip back side 218; insulation material 224 including: first insulation portion 224a formed over first chip lateral side 226; second insulation portion 224b formed over second chip lateral side 228, wherein first chip lateral side 226 and second chip lateral side 228 each abuts opposite edges of the chip back side 218; and third insulation portion 224c formed over at least part of chip front side 204, chip front side 204 including one or more electrical contacts 214, 216 formed within chip front side 204; wherein at least part of first insulation portion 224a is arranged over chip-carrier side 252 and wherein first insulation portion 224a is configured to extend in a direction perpendicular to first chip lateral side 226 further than chip-carrier 246.

FIGS. 6A to 6E show method 600 for forming a chip-package according to an embodiment.

Figure 6A:
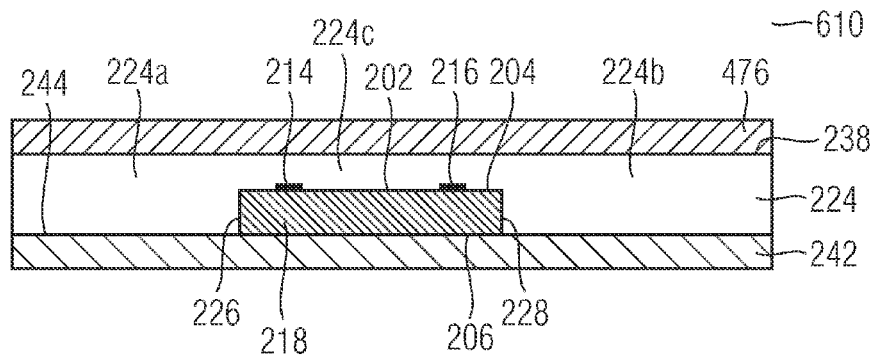
FIGS. 6A to 6E provide a method for forming a chip-package according to an embodiment, and FIG. 6E additionally provides a chip-package according to an embodiment.
Figure 6B:
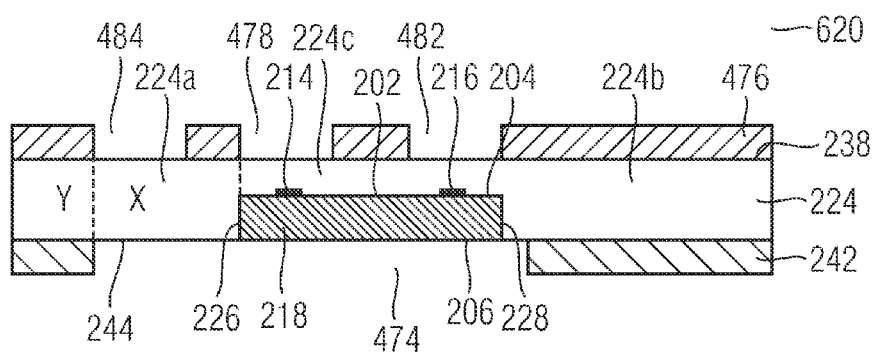
Figure 6C:
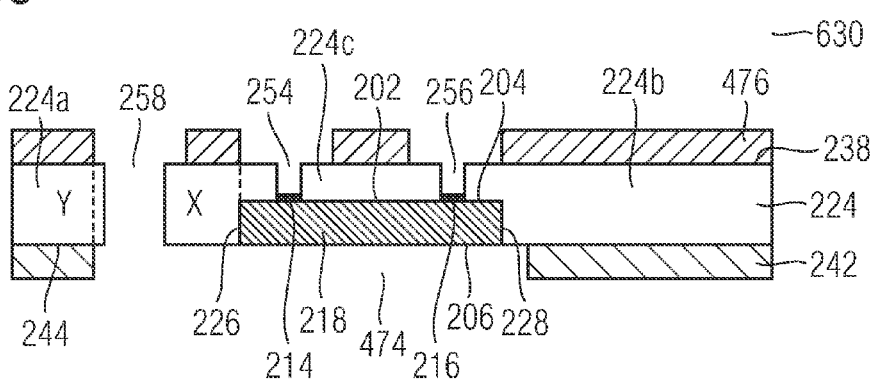

Method 600 as shown in FIGS. 6A to 6C may be carried out according to FIGS. 4A to 4C of method 400 already described above. The basic functionalities of all the features described with respect to method 400 are applicable to method 600.

Figure 6D:
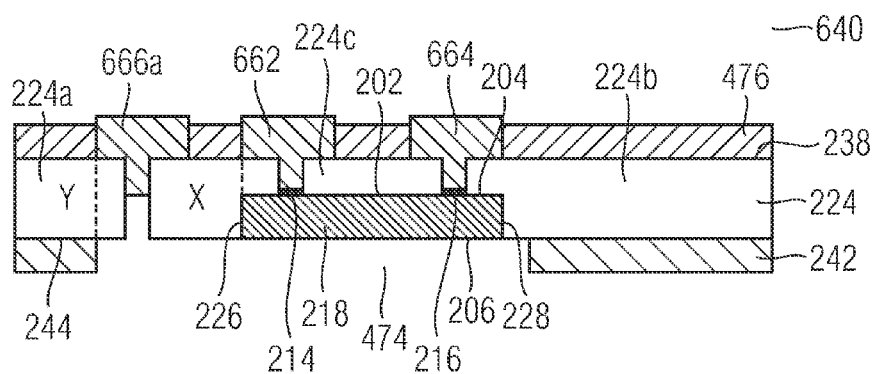
Figure 6E:
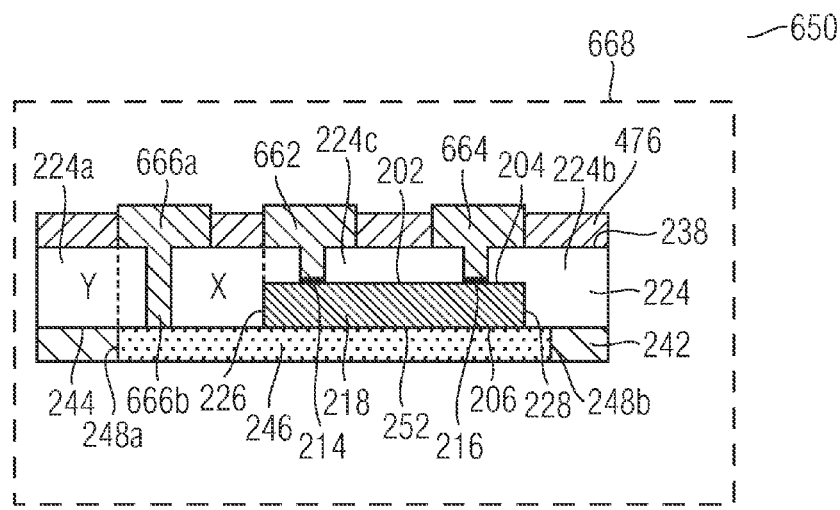

As shown in FIG. 6D, chip-carrier 246, one or more electrical interconnects 662, 664, and further electrical interconnect 666 may be formed. One or more electrical interconnects 662, 664, and part of further electrical interconnect 666a may be formed in single deposition process, or in separate deposition processes from insulation material front side 238.

A single deposition process, e.g. a galvanic process, e.g. a printing paste process, may be carried out to deposit one or more electrical interconnects 662, 664, and part of further electrical interconnect 666a, from insulation material front side 238.

A single deposition process, e.g. a galvanic process, e.g. a printing paste process, may be carried out to deposit chip-carrier 246 and part of further electrical interconnect 666b, from insulation material back side 238.

Chip-carrier 246 may be deposited such that further insulation material 242 may be proximate to chip-carrier 246, e.g. further insulation material 242 may be adjacent to chip-carrier sidewalls 248a, 248b. Chip 202 may thereby be arranged over chip-carrier side 252, wherein chip-carrier side 252 may be in electrical connection with a chip back side 206, e.g. with electrical contact 218 formed over chip back side 206.

Chip 202 may thereby be arranged over chip-carrier side 252, wherein chip-carrier side 252 may be in electrical connection with a chip back side 206, e.g. with electrical contact 218 formed over chip back side 206. Chip-carrier 246 may include at least one from the following group of materials, the group consisting of: tin, lead, silver, copper, nickel, zinc, aluminum, gold, antimony, inorganic elements and organic elements. Chip-carrier 246 may include an alloy including at least one from the group of materials, including small amounts of at least one of the inorganic elements and organic elements.

Chip-carrier 246 may have a thickness ranging from about 1 µm to about 400 µm, e.g. from about 100 µm to about 300 µm, e.g. from about 150 µm to about 250 µm. Chip-carrier 246 may include an electrically conductive material. Chip-carrier 246 may include an electrically conductive material deposited over chip back side 206 by a semi-additive process.

Chip 202 may thereby be arranged over chip-carrier side 252, wherein at least part of first insulation portion 224a may be arranged over chip-carrier side 252 wherein first insulation portion 224a extends in a direction perpendicular to the first chip lateral side 226 further than chip-carrier 246. First insulation portion 224a may therefore include a portion X arranged over chip-carrier side 252, and an extension portion Y that is arranged adjacent to portion X and opposite to first chip lateral side 226, such that first insulation portion 224a extends in a direction perpendicular to first chip lateral side 226 further than chip-carrier 246. Extension portion Y may be arranged such that extension portion Y is not arranged over chip-carrier side 252, therefore, first insulation portion 224a extends in a direction perpendicular to first chip lateral side 226 away from first chip lateral side 226, i.e. away from chip 202, further than chip-carrier 246.

Further insulation material 242 may be formed over a part of first insulation portion 224a which extends in a direction perpendicular to first chip lateral side 226 further than chip-carrier 246. Further insulation material 242 may be formed over a part of first insulation portion 224a, e.g. extension portion Y of first insulation portion 224a, wherein extension portion Y may be arranged such that first insulation portion 224a extends in a direction perpendicular to first chip lateral side 226 further than chip-carrier 246.

Second insulation portion 224b may extend in a direction perpendicular to second chip lateral side 228 further than chip-carrier 246. Second insulation portion 224b may be arranged such that second insulation portion 224b may or may not be arranged over chip-carrier side 252. Second insulation portion 224b may extend in a direction perpendicular to second chip lateral side 228 away from second chip lateral side 228, i.e. away from chip 202, further than chip-carrier 246.

Further insulation material 242 may be configured proximate to chip-carrier 246. Further insulation material 242 may be formed over a part of second insulation portion 224b which extends in a direction perpendicular to second chip lateral side 228 further than chip-carrier 246.

One or more electrical interconnects 662, 664 may be formed in through-holes 254, 256, and further electrical interconnect 666, including further electrical interconnect portions 666a, 666b, in through-hole 258. One or more electrical interconnects 662, 664, 666 may be formed by filling through-holes 254, 256, 258 with an electrically conductive material, e.g. tin, lead, silver, copper, nickel, zinc, aluminum, gold, antimony, inorganic elements and organic elements. Chip-carrier 246 may include an alloy including at least one from the group of materials, including small amounts of at least one of the inorganic elements and organic elements.

One or more electrical interconnects 662, 664 may be configured to be in electrical connection with one or more electrical contacts 214, 216 formed over chip first side 204 formed over chip first side 204, e.g. electrical interconnect 662 may be configured to be in electrical connection with electrical contact 216, e.g. e.g. electrical interconnect 664 may be configured to be in electrical connection with electrical contact 214. Further electrical interconnect 666 may be configured to be in electrical connection with the chip-carrier side 252. Further electrical interconnect 666 may be configured to extend substantially vertically away from chip-carrier side 252, through insulation material 224. Further electrical interconnect 666 may be configured to extend substantially vertically away from chip-carrier side 252, through first insulation portion 224a.

One or more cavities 478, 482, 484 may be filled with an electrically conductive material, e.g. copper. One or more cavities 478, 482, 484 may be filled with an electrically conductive material from one or more electrical interconnects 662, 664, 666. One or more electrical interconnects 662, 664, 666 may include one or more electrical contact pads formed in one or more cavities 478, 482, 484, over insulation material front side 238.

Insulation material 224 may be configured to electrically insulate one or more electrical interconnects 662, 664 in electrical connection with one or more electrical contacts 214, 216, wherein one or more electrical interconnects 662, 664 may be configured to extend substantially vertically away from chip front side 204, through third insulation portion 224c. Insulation material 224 may be configured to electrically insulate further electrical interconnects 666, in electrical connection with chip-carrier side 252, from one or more electrical interconnects 662, 664 in electrical connection with one or more electrical contacts 214, 216. Further electrical interconnects 666 may be configured to extend substantially vertically away from chip-carrier side 252 through first insulation portion 224b.

Chip-package 668 may be individualized by separating, e.g. dicing, through insulation material 224, further insulation material 242 and second further insulation material 476. Chip-package 668b may be individualized by separating, e.g. dicing, through first insulation portion 224a, further insulation material 242 and second further insulation material 476. Chip-package 668b may be individualized by separating, e.g. dicing, through extension portion Y of first insulation portion 224a, further insulation material 242 and second further insulation material 476. Chip-package 668b may be individualized by separating, e.g. dicing, through second insulation portion 224b, further insulation material 242 and second further insulation material 476. In other words, chip-package 668b may be individualized without dicing through chip-carrier 246, therefore chip-package 668b may be individualized by separating, e.g. dicing, through a single type of material.

According to various embodiments, further insulation material 242 and second further insulation material 476 may be removed, e.g. by stripping, e.g. by dissolving, e.g. by etching. Chip-package 668b (not shown), but as shown in FIG. 4D, may be individualized by separating, e.g. dicing, through insulation material 224. Chip-package 668 may be individualized by separating, e.g. dicing, through first insulation portion 224a. Chip-package 668 may be individualized by separating, e.g. dicing, through extension portion Y of first insulation portion 224a. Chip-package 668 may be individualized by separating, e.g. dicing, through second insulation portion 224b. In other words, chip-package 668 may be individualized without dicing through chip-carrier 246, therefore chip-package 668 may be individualized by separating, e.g. dicing, through a single type of material.

Chip-package 668 is therefore provided, wherein chip-package 668 may include: a chip-carrier 246 configured to carry chip 202, chip 202 arranged over a chip-carrier side 252, wherein chip-carrier side 252 is configured to be in electrical connection with chip back side 218; insulation material 224 including: first insulation portion 224a formed over first chip lateral side 226; second insulation portion 224b formed over second chip lateral side 228, wherein first chip lateral side 226 and second chip lateral side 228 each abuts opposite edges of the chip back side 218; and third insulation portion 224c formed over at least part of chip front side 204, chip front side 204 including one or more electrical contacts 214, 216 formed within chip front side 204; wherein at least part of first insulation portion 224a is arranged over chip-carrier side 252 and wherein first insulation portion 224a is configured to extend in a direction perpendicular to first chip lateral side 226 further than chip-carrier 246.

Various embodiments may include processing on a roll or coil with carrier dimensions on the meter scale, by printing the conductive materials 246, 262 and 266 inside the surface cavities. For thicker substrate thicknesses, e.g. thickness larger than 50 μm, print processes (stencil, screen print, ink-jet) may be used.

Various embodiments provide a method for forming a chip-package, wherein the construction of a chip-embedded package is carried out by omitting traditional die attach process, e.g. by gluing, e.g. soldering a chip onto an already manufactured leadframe carrier.

According to various embodiments, a chip-carrier for carrying a chip is formed, i.e. deposited, after the manufacturing of a chip.

According to various embodiments, a chip-carrier for carrying a chip is formed during the chip-packaging process for packaging a chip. According to various embodiments, a chip-carrier for carrying a chip is formed, after the deposition of an insulation material for insulating the chip. According to various embodiments, the required drain contact surface may be deposited by a semi-additives procedure.

According to various embodiments, a step-cut sawing process through a leadframe carrier no longer needs to take place.

According to various embodiments, pre-structuring of leadframe carrier before attaching to the chip, no longer needs to take place.

According to various embodiments, individualizing an embedded chip module wherein a chip is carried by a chip-carrier, may take places without separating, e.g. sawing through a conventional leadframe carrier.

According to various embodiments, the construction of a module, e.g. a chip-package, with large area dimensions, which does not depend on the geometry of a pre-structured leadframe, may be implemented. Cost savings for each process can be clearly increased. Furthermore, processing efficiency is considerably improved due to the elimination of traditionally challenging processes.

Various embodiments provide a chip-package including: a chip-carrier configured to carry a chip, the chip arranged over a chip-carrier side, wherein the chip-carrier side is configured to be in electrical connection with a chip back side; an insulation material including: a first insulation portion formed over a first chip lateral side; a second insulation portion formed over a second chip lateral side, wherein the first chip lateral side and the second chip lateral side each abuts opposite edges of the chip back side; and a third insulation portion formed over at least part of a chip front side, the chip front side including one or more electrical contacts formed within the chip front side; wherein at least part of the first insulation portion is arranged over the chip-carrier side and wherein the first insulation portion is configured to extend in a direction perpendicular to the first chip lateral side further than the chip-carrier.

According to an embodiment, the chip includes at least one semiconductor device from the following group of semiconductor devices, the group consisting of: a transistor, a MOS transistor, a bipolar transistor, a field effect transistor, a diode.

According to an embodiment, the chip includes at least one power semiconductor device from the following group of power semiconductor devices, the group consisting of: a power transistor, a power MOS transistor, a power bipolar transistor, a power field effect transistor, a power insulated gate bipolar transistor IGBT, a thyristor, a MOS controlled thyristors, a silicon controlled rectifier, a power schottky diode, a silicon carbide diode, a gallium nitride device.

According to an embodiment, the one or more electrical contacts formed within the chip front side includes one or more electrical contact pads.

According to an embodiment, the chip back side includes at least one electrical contact for a semiconductor device.

According to an embodiment, the chip back side includes at least one of a source contact and a drain contact for a semiconductor device.

According to an embodiment, the chip-carrier includes an electrically conductive material.

According to an embodiment, the chip-carrier includes an electrically conductive material deposited over the chip back side by a semi-additive process.

According to an embodiment, the chip-carrier includes at least one from the following group of materials, the group consisting of: tin, lead, silver, copper, nickel.

According to an embodiment, the chip-carrier has a thickness ranging from about 1 μm to about 400 μm.

According to an embodiment, the insulation material includes at least one from the following group of materials, the group consisting of: plastic, unfilled plastic, plastic filled with glass, plastic filled with ceramic, plastic filled with ceramic particles, plastic filled with glas fibres, plastic polymers, plastic polymer based on a thermoset, plastic polymer based on a thermoplast and a resin.

According to an embodiment, the insulation material is configured to electrically insulate the one or more electrical contacts formed within the chip front side.

According to an embodiment, the insulation material is configured to electrically insulate one or more electrical interconnects in electrical connection with the one or more electrical contacts, wherein the one or more electrical interconnects are configured to extend substantially vertically away from chip front side, through the third insulation portion.

According to an embodiment, the chip-package further includes at least one further electrical interconnect in electrical connection with the chip-carrier side, wherein the at least one further electrical interconnect is configured to extend substantially vertically away from chip-carrier side, through the first insulation portion.

According to an embodiment, the second insulation portion is configured to extend in a direction perpendicular to the second chip lateral side further than the chip-carrier.

According to an embodiment, the chip-package further includes a further insulation material configured proximate to the chip-carrier, the further insulation material configured over a part of the first insulation portion which extends in a direction perpendicular to the first chip lateral side further than the chip-carrier.

According to an embodiment, the chip-package further includes a further insulation material configured proximate to the chip-carrier, the further insulation material configured over a part of the second insulation portion which extends in a direction perpendicular to the second chip lateral side further than the chip-carrier.

According to an embodiment, the further insulation material includes at least one from the following group of materials, the group consisting of: plastic, unfilled plastic, plastic filled with glass, plastic filled with ceramic, plastic filled with ceramic particles, plastic filled with glas fibres, plastic polymers, plastic polymer based on a thermoset, plastic polymer based on a thermoplast and a resin.

Various embodiments provide a method for forming a chip-package, the method including: forming an insulation material by forming a first insulation portion over a first chip lateral side, forming a second insulation portion over a second chip lateral side, wherein the first chip lateral side and the second chip lateral side each abuts opposite edges of a chip back side; and forming a third insulation portion over at least part of a chip front side, the chip front side including one or more electrical contacts formed within the chip front side; arranging the chip over a chip-carrier side, wherein the chip-carrier side is in electrical connection with the chip back side; wherein at least part of the first insulation portion is arranged over the chip-carrier side wherein the first insulation portion extends in a direction perpendicular to the first chip lateral side further than the chip-carrier.

According to an embodiment, the method further includes forming a further insulation material over a chip back side and over a part of the first insulation portion and subsequently depositing a chip-carrier over the chip back side, thereby arranging the chip over the chip-carrier side, wherein the chip-carrier side is in electrical connection with a chip back side.

According to an embodiment, depositing the chip-carrier over the chip back side includes depositing the chip-carrier wherein the further insulation material is proximate to the chip-carrier, and wherein the further insulation material is formed over a part of the first insulation portion which extends in a direction perpendicular to the first chip lateral side further than the chip-carrier.

According to an embodiment, the method further includes individualizing the chip-package by dicing through the first insulation portion.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip-package comprising:
   a chip-carrier configured to carry a chip, the chip arranged over a chip-carrier side, wherein the chip-carrier side is configured to be in electrical connection with a chip back side;
   an insulation material comprising:
   a first insulation portion formed over a first chip lateral side;
   a second insulation portion formed over a second chip lateral side, wherein the first chip lateral side and the second chip lateral side each abuts opposite edges of the chip back side;
   a third insulation portion formed over at least part of a chip front side, the chip front side comprising one or more electrical contacts formed within the chip front side;
   wherein at least part of the first insulation portion is arranged over the chip-carrier side and wherein the first insulation portion is configured to extend in a direction perpendicular to the first chip lateral side further than the chip-carrier; and
   wherein the second insulation portion is configured to extend in a direction perpendicular to the second chip lateral side further than the chip-carrier;
   a further insulation material configured proximate to the chip-carrier and over a back side of the insulation material, the further insulation material comprising:
   a first further insulation portion configured over the part of the first insulation portion which extends in a direction perpendicular to the first chip lateral side further than the chip-carrier; and
   a second further insulation portion configured over the second insulation portion which extends in a direction perpendicular to the second chip lateral side further than the chip-carrier.

2. The chip-package according to claim 1, wherein the chip comprises at least one semiconductor device from the following group of semiconductor devices, the group consisting of: a transistor, a MOS transistor, a bipolar transistor, a field effect transistor, a diode.

3. The chip-package according to claim 1, wherein the chip comprises at least one power semiconductor device from the following group of power semiconductor devices, the group consisting of: a power transistor, a power MOS transistor, a power bipolar transistor, a power field effect transistor, a power insulated gate bipolar transistor IGBT, a thyristor, a MOS controlled thyristor, a silicon controlled rectifier, a power schottky diode, a silicon carbide diode, a gallium nitride device.

4. The chip-package according to claim 1, wherein the one or more electrical contacts formed within the chip front side comprises one or more electrical contact pads.

5. The chip-package according to claim 1, wherein the chip back side comprises at least one semiconductor device electrical contact.

6. The chip-package according to claim 1, wherein the chip back side comprises at least one of a semiconductor device source contact and a semiconductor device drain contact.

7. The chip-package according to claim 1, wherein the chip-carrier comprises an electrically conductive material.

8. The chip-package according to claim 1, wherein the chip-carrier comprises an electrically conductive material deposited over the chip back side.

9. The chip-package according to claim 1, wherein the chip-carrier comprises at least one from the following group of materials, the group consisting of: tin, lead, silver, copper, nickel.

10. The chip-package according to claim 1, wherein the chip-carrier has a thickness ranging from about 1 μm to about 400 μm.

11. The chip-package according to claim 1, wherein the insulation material comprises at least one from the following group of materials, the group consisting of: plastic, unfilled plastic, plastic filled with glass, plastic filled with ceramic, plastic filled with ceramic particles, plastic filled with glass fibres, plastic polymers, plastic polymer based on a thermoset, plastic polymer based on a thermoplast and a resin.

12. The chip-package according to claim 1, wherein the insulation material is configured to electrically insulate the one or more electrical contacts formed within the chip front side.

13. The chip-package according to claim 1, wherein the insulation material is configured to electrically insulate one or more electrical interconnects in electrical connection with the one or more electrical contacts, wherein the one or more electrical interconnects are configured to extend substantially vertically away from chip front side, in through-holes in the third insulation portion.

14. The chip-package according to claim 13, further comprising at least one further electrical interconnect in electrical connection with the chip-carrier side, wherein the at least one further electrical interconnect is configured to extend substantially vertically away from chip-carrier side, in a through-hole in the first insulation portion.

15. The chip-package according to claim 1, wherein the further insulation material comprises at least one from the following group of materials, the group consisting of: plastic, unfilled plastic, plastic filled with glass, plastic filled with ceramic, plastic filled with ceramic particles, plastic filled with glass fibres, plastic polymers, plastic polymer based on a thermoset, plastic polymer based on a thermoplast and a resin.

* * * * *